United States Patent
Park

[11] Patent Number: 5,930,626
[45] Date of Patent: Jul. 27, 1999

[54] METHOD OF FABRICATING CAPACITOR OF MEMORY CELL

[75] Inventor: Ki-Yeol Park, Daekukwangyok-si, Rep. of Korea

[73] Assignee: LG Semicon Co., Ltd., Chungcheongbuk-Do, Rep. of Korea

[21] Appl. No.: 08/743,000

[22] Filed: Nov. 1, 1996

[30] Foreign Application Priority Data

May 8, 1996 [KR] Rep. of Korea ............... 96 15080

[51] Int. Cl.⁶ .................................. H01L 21/8242
[52] U.S. Cl. ................... 438/254; 438/255; 438/397; 438/398; 438/960; 438/964
[58] Field of Search ............... 148/DIG. 14; 257/309, 257/308; 438/255, 398, 665, 960, 964, 253, 254, 396, 397

[56] References Cited

U.S. PATENT DOCUMENTS

| | | | |
|---|---|---|---|
| 5,049,517 | 9/1991 | Liu et al. | 438/397 |
| 5,068,199 | 11/1991 | Sandhu | 438/255 |
| 5,372,962 | 12/1994 | Hirota et al. | 438/398 |
| 5,457,065 | 10/1995 | Huang et al. | 437/60 |
| 5,597,760 | 1/1997 | Hirota | 438/398 |
| 5,723,373 | 3/1998 | Chang et al. | 438/253 |

*Primary Examiner*—Peter Toby Brown
*Assistant Examiner*—Toniae M. Thomas
*Attorney, Agent, or Firm*—Morgan, Lewis & Bockius LLP

[57] ABSTRACT

The method of fabricating a capacitor of a memory cell is disclosed including the steps of forming a transistor on a semiconductor substrate; sequentially forming an etch stop layer, an insulating layer and a first conductive layer on the semiconductor substrate and the transistor; converting a portion of the first conductive layer into a first porous layer through anodization; patterning a predetermined portion of the first porous layer to form a storage node contact; forming a second conductive layer on the semiconductor substrate and the first porous layer; converting a portion of the second conductive layer into a second porous layer through anodization; patterning a portion of the second porous layer and forming a storage node electrode pattern through an etching process; forming a dielectric layer on an overall surface of the storage node electrode pattern; and forming a third conductive layer on an overall surface of the dielectric layer.

15 Claims, 4 Drawing Sheets

METHOD OF FABRICATING CAPACITOR OF MEMORY CELL

BACKGROUND OF THE INVENTION

1. Field of the Invention

The present invention relates to a method of fabricating a capacitor of a memory cell and, more particularly, to a method of fabricating a memory cell capacitor having a larger capacitance.

2. Discussion of Related Art

As semiconductor memory devices become highly integrated, the area occupied by a memory cell is reduced. Generally, the reduction of the cell size results in the decrease of the effective area of a storage capacitor of the cell. This reduces its capacitance. In a dynamic random access memory (DRAM) cell, the reduction of its capacitance increases soft error or deteriorates the refreshing function of its cell. Accordingly, studies have been carried out for the purpose of increasing the cell capacitance through the extension of the effective area of the cell. Increasing the cell capacitance is an important factor in the high integration of semiconductor memory devices. Structures for extending the effective area of a capacitor include a stacked structure and a trench structure. The stacked structure is formed in such a manner that several layers of capacitors are stacked on a semiconductor substrate. In the trench structure, a trench is formed in a semiconductor substrate and a capacitor is formed in the trench.

A conventional method of fabricating a capacitor of a memory cell will be explained now with reference to the accompanying drawings. FIGS. 1A to 1F are cross-sectional views showing a conventional method of fabricating a fin-structured stacked capacitor. As shown in FIG. 1A, a field oxide layer 101 is formed on a p-type silicon substrate 100. A gate insulating layer 102, a polysilicon layer 103 and a cap insulating layer 104 are sequentially formed on the substrate 100, and selectively etched through photolithography to form a gate electrode. Then, n-type impurities are ion-implanted into the substrate at a low concentration. A chemical vapor deposition (CVD) oxide layer is formed on the overall surface of the silicon substrate 100, and etched through photolithography to form sidewall spacers 105 on the sides of the gate electrode. Thereafter, n-type impurities are ion-implanted into the substrate at a high concentration to thereby form source and drain regions 106.

As shown in FIG. 1B, an etch stop layer 107, a first insulating layer 108, a first storage node polysilicon layer 109 and a second insulating layer 110 are sequentially formed on the overall surface of the silicon substrate 100. The etch stop layer 107 is formed of silicon nitride. As shown in FIG. 1C, a storage node contact region of a capacitor is defined, and then the second insulating layer 110, first storage node polysilicon layer 109, first insulating layer 108 and etch stop layer are selectively removed to expose the storage node contact region.

As shown in FIG. 1D, a second storage node polysilicon layer 111 is deposited on the overall surface of the second insulating layer 110 including the exposed portion of the substrate. Then, as shown in FIG. 1E, the second and first insulating layers are removed through an etching process to thereby form a storage node electrode consisting of the first and second storage node polysilicon layers 109 and 111. Thereafter, as shown in FIG. 1F, a dielectric layer 112 is formed on the overall surface of the storage node electrode. A conductive layer 113, such as a polysilicon layer, is formed on the overall surface of the dielectric layer 112 and patterned to form a plate electrode.

In the aforementioned fin-structured capacitor, as the cell area is reduced, a multilevel storage electrode is required to maintain its capacitance. This results in poor topography in the memory cell. Accordingly, the reliability of the memory device is deteriorated.

SUMMARY OF THE INVENTION

Accordingly, the present invention is directed to a method of fabricating a capacitor of a memory cell that substantially obviates one or more of the problems due to limitations and disadvantages of the related art.

An object of the present invention is to provide a method of fabricating a capacitor of a memory cell, with increased capacitance and improved reliability.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method of fabricating a capacitor of a memory cell includes the steps of forming a transistor on a semiconductor substrate, sequentially forming an etch stop layer, an insulating layer and a first conductive layer on the overall surface of the semiconductor substrate, converting a portion of the first conductive layer into a first porous layer through anodization, patterning a predetermined portion of the first porous layer to form a storage node contact, forming a second conductive layer on the overall surface of the semiconductor substrate and the first porous layer, converting a portion of the second conductive layer into a second porous layer through anodization, patterning a portion of the second porous layer and forming a storage node electrode pattern through etching process, forming a dielectric layer on the overall surface of the storage node electrode pattern, and forming a third conductive layer on the overall surface of the dielectric layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
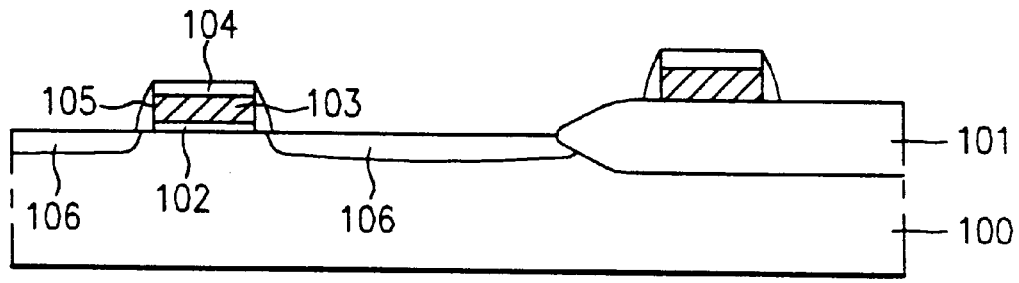
FIGS. 1A to 1F are cross-sectional views showing a conventional process of fabricating a memory cell capacitor.
Figure 1B:
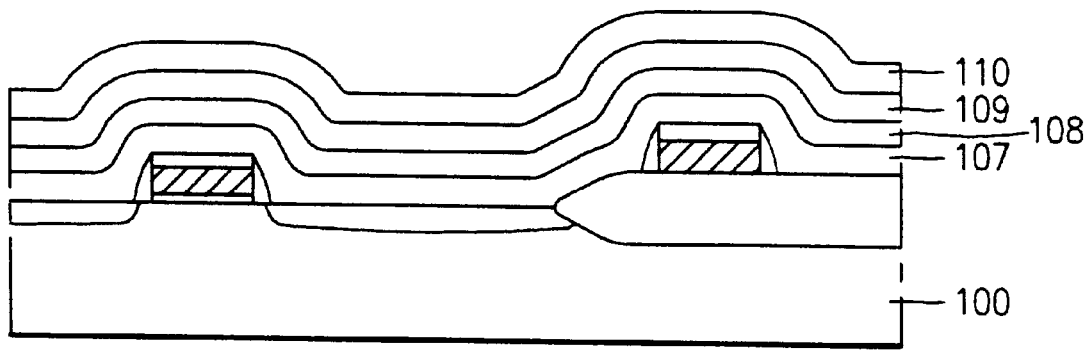
Figure 1C:
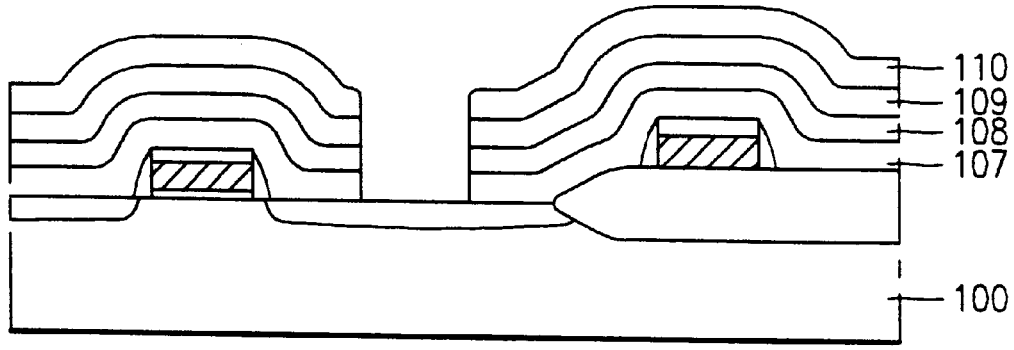
Figure 1D:
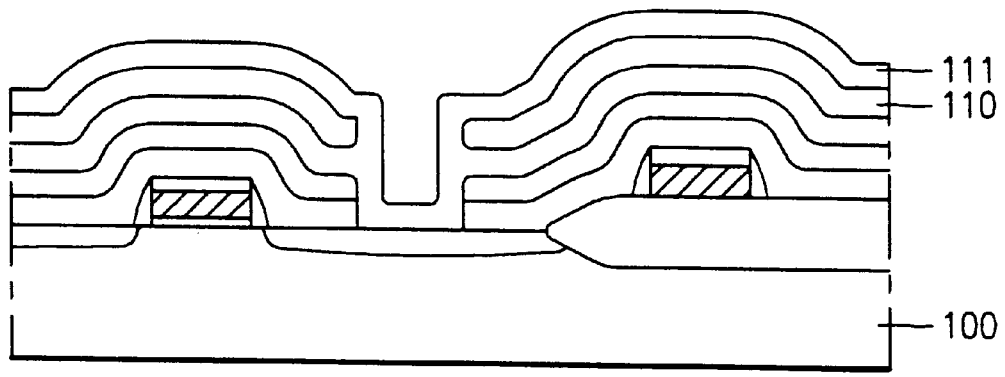
Figure 1E:
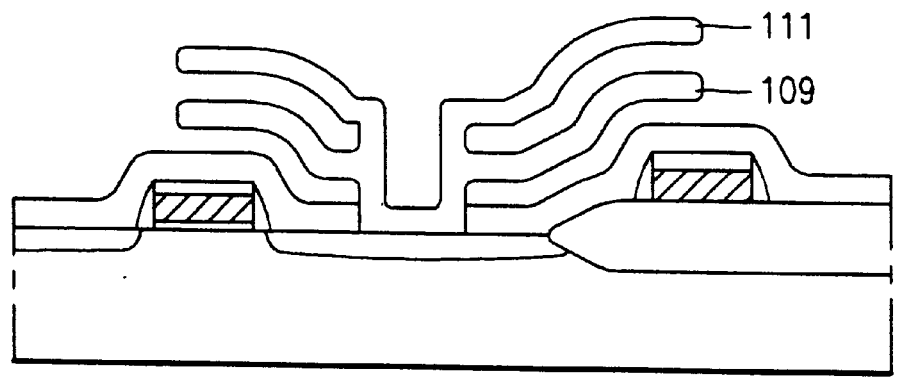
Figure 1F:
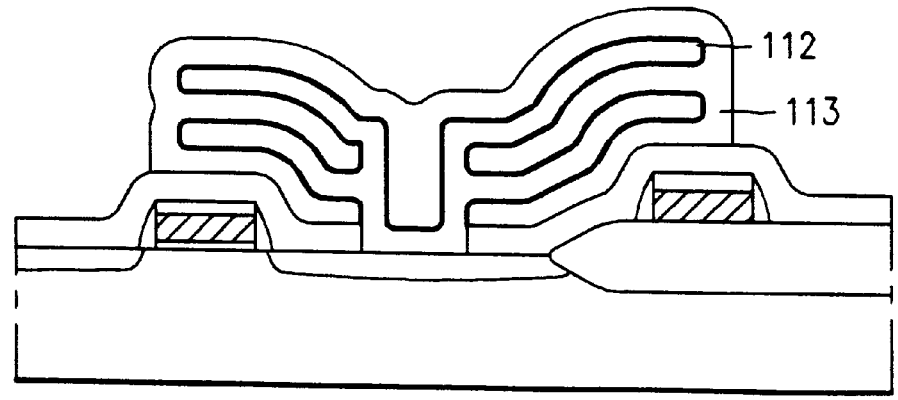
Figure 2A:
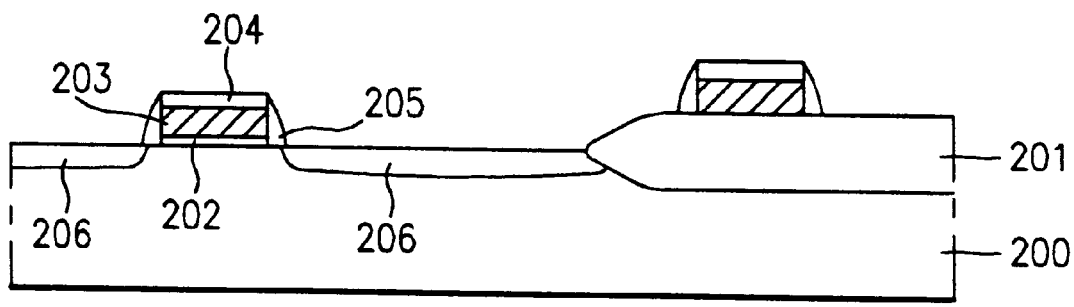
FIGS. 2A to 2F are cross-sectional views showing a method of fabricating a memory cell capacitor according to an embodiment of the present invention.

FIGS. 2A to 2F are cross-sectional views showing a method of fabricating a memory cell capacitor according to an embodiment of the present invention. Referring to FIG. 2A, a field oxide layer 201 is formed on a p-type silicon substrate 200. A gate insulating layer 202, a polysilicon layer 203 and a cap insulating layer 204 are sequentially formed on the substrate 200, and selectively etched through photolithography to form a gate electrode. Then, n-type impurities are ion-implanted into the substrate at a low concentration. A CVD oxide layer is formed on the overall surface of the silicon substrate 200, and etched through photolithography to form sidewall spacers 205 on the sides of the gate electrode. Thereafter, n-type impurities are ion-implanted into the substrate at a higher concentration to thereby form source and drain regions 206. By doing so, a transistor is completed.

Figure 2B:
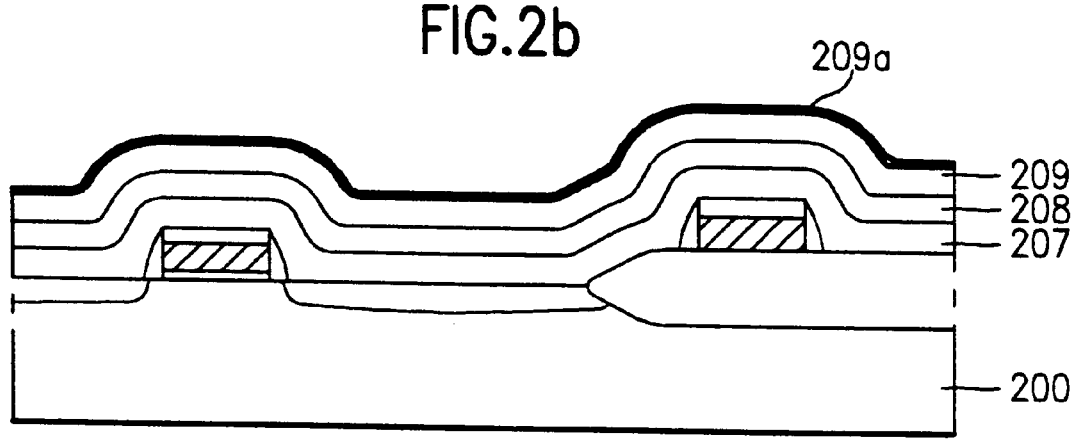

Referring to FIG. 2B, an etch stop layer 207, an insulating layer 208 and a first storage node polysilicon layer 209 are sequentially formed on the overall surface of the silicon substrate 200. The etch stop layer is preferably formed of silicon nitride. Here, if the first storage node polysilicon layer 209 is dipped into HF solution and irradiated with light, anodization occurs in the first storage node polysilicon layer 209. Accordingly, a portion of the first storage node polysilicon layer 209 is changed into a first porous silicon layer by a predetermined thickness. Thereafter, dry oxidation is carried out to the first porous silicon layer to thereby change it into a first porous oxide layer 209a. Here, the concentration of HF solution is preferably around 20% to 48%, and the irradiation of light is provided by a halogen lamp. The dry oxidation is preferably carried out at a temperature around 950° C. for 30 minutes.

Figure 2C:
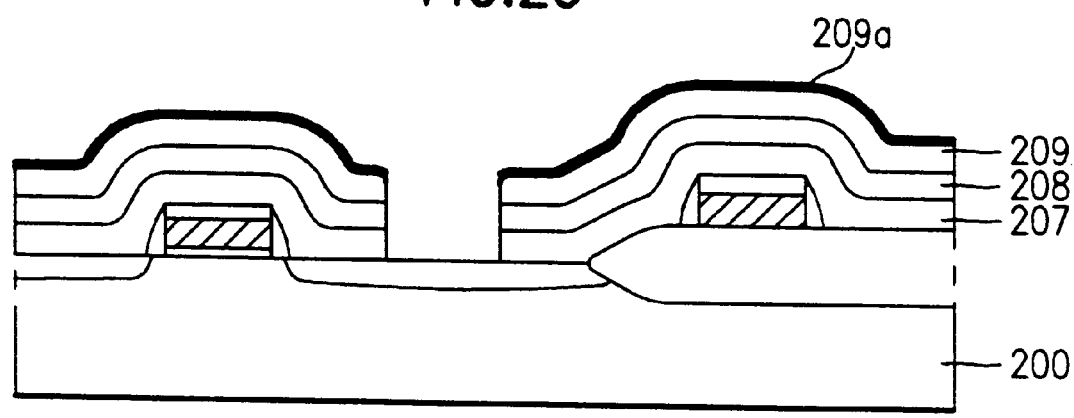

Referring to FIG. 2C, a storage node contact region of a capacitor is defined, and then the first porous oxide layer 209a, first storage node polysilicon layer 209, insulating layer 208 and etch stop layer 207 are selectively removed to expose the storage node contact region.

Figure 2D:
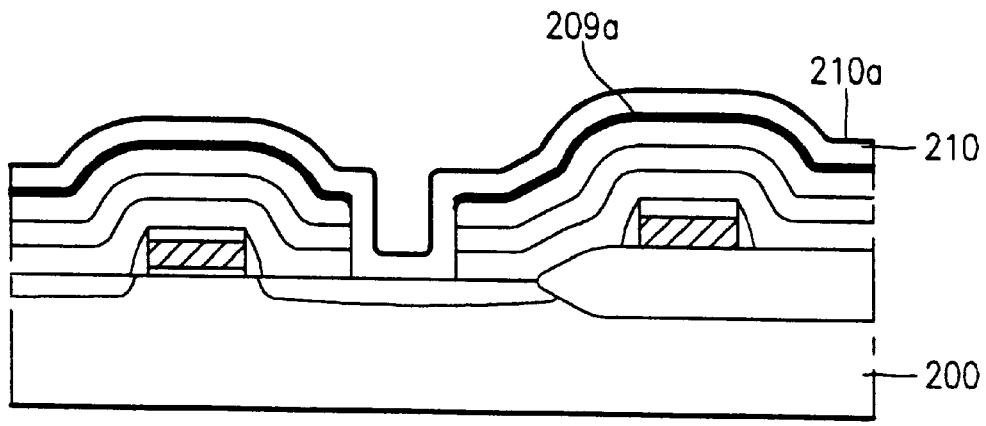

Referring to FIG. 2D, a second storage node polysilicon layer 210 is deposited on the overall surface of the first porous oxide layer 209a including the exposed portion of the substrate. Then, if the second storage node polysilicon layer 210 is dipped into HF solution and irradiated with light, anodization occurs in the second storage node polysilicon layer 210. Accordingly, a portion of the second storage node polysilicon layer 210 is changed into a second porous silicon layer by a predetermined thickness. Here, the second porous silicon layer is preferably formed thinner than the first porous silicon layer. Thereafter, dry oxidation is carried out to the second porous silicon layer to thereby change it into a second porous oxide layer 210a. The concentration of HF solution is preferably around 20% to 48%, and the irradiation of light is provided by a halogen lamp . The dry oxidation is preferably carried out at a temperature around 950° C. for 30 minutes.

Figure 2E:
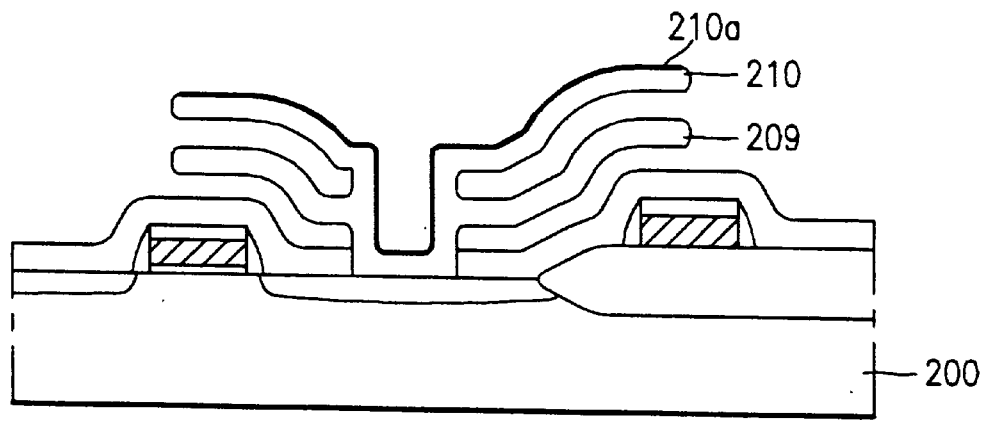

Referring to FIG. 2E, a predetermined photoresist pattern (not shown) is formed on the second porous oxide layer 210a. The second porous oxide layer 210a, second storage node polysilicon layer 210, first porous oxide layer 209a, first storage node polysilicon layer 209 and insulating layer 208 are selectively removed through dry etching using the photoresist pattern as a mask, to thereby form a storage node electrode pattern which is constructed in such a manner that the first and second storage node polysilicon layers 209 and 210 are connected. Thereafter, without removing the photoresist pattern formed on the second porous oxide layer 210a, the insulating layer 208 and the first porous oxide layer 209a (disposed between the second and first storage node polysilicon layers 210 and 209) are removed through wet etching using HF solution.

Figure 2F:
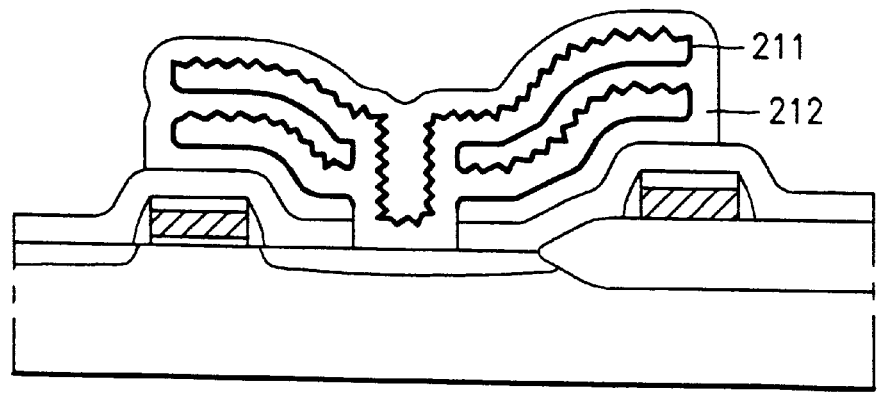

Referring to FIG. 2F, a dielectric layer 211, such as an oxide layer, is formed on the overall surface of the storage node electrode pattern. A conductive layer 212, such as a polysilicon layer, is formed on the overall surface of the dielectric layer, and patterned to form a plate electrode. Here, since the dielectric layer 211 (such as an oxide layer) is formed on the second porous layer 210a slower than on a portion between the first and second storage node polysilicon layers, it has a relatively uniform thickness.

According to the present invention, since fine ruggedness is formed on the surface of the polysilicon layers where the porous layer is formed, its surface area is increased. This improves the capacitance of the memory cell and its reliability.

It will be apparent to those skilled in the art that various modifications and variations can be made in the method of fabricating a memory cell capacitor of the present invention without departing from the spirit or scope of the invention. Thus, it is intended that the present invention cover the modifications and variations of this invention provided they come within the scope of the appended claims and their equivalents.

What is claimed is:

1. A method of fabricating a capacitor of a memory cell, comprising the steps of:

forming a transistor on a semiconductor substrate;

sequentially forming an etch stop layer, an insulating layer, and a first conductive layer over the substrate including the transistor;

converting a portion of the first conductive layer into a first porous layer through anodization;

patterning a selected portion of the first porous layer, the first conductive layer, the insulating layer, and the etch stop layer to form a storage node contact hole exposing a portion of the substrate;

forming a second conductive layer on the first porous layer, in the hole, and contacting the exposed portion of the substrate;

converting a portion of the second conductive layer into a second porous layer through anodization;

forming a photoresist pattern on the second porous layer;

using the photoresist pattern as a mask, selectively removing a portion of the second porous layer, the second conductive layer, the first porous layer, the first conductive layer, and the insulating layer to form a storage node electrode pattern;

performing a wet etch to remove the first porous layer and the insulating layer, thereby, forming a fin-shaped storage node electrode;

removing the photoresist pattern;

forming a dielectric layer on the storage node electrode; and forming a third conductive layer on the dielectric layer.

2. The method claimed in claim 1, wherein the step of converting the first conductive layer into a first porous layer comprises the steps of:

dipping the first conductive layer in a HF solution;

irradiating light to the first conductive layer; and dry-oxidizing the first conductive layer; and wherein the step of converting the second conductive layer to a second porous layer comprises the steps of:

dipping the second conductive layer in a HF solution;

irradiating light to the second conductive layer; and dry-oxidizing the second conductive layer.

3. The method claimed in claim 2, wherein the concentration of the HF solution is approximately 20% to 48%.

4. The method claimed in claim 2, wherein the step of irradiating with light uses a halogen lamp as a light source.

5. The method claimed in claim 2, wherein the dry oxidation is carried out at a temperature around 950° C. for 30 minutes.

6. The method claimed in claim 1, wherein the first porous layer is thicker than the second porous layer.

7. A method of fabricating a capacitor of a memory cell, comprising the steps of:

forming a transistor on a semiconductor substrate;

forming a first conductive layer over the substrate including the transistor;

converting a portion of the first conductive layer into a first porous layer;

patterning a portion of the first porous layer and the first conductive layer to form a storage node contact hole;

forming a second conductive layer on the first porous layer and in the hole;

converting a portion of the second conductive layer into a second porous layer;

etching a selected portion of the second porous layer, the second conductive layer, the first porous layer, and the first conductive layer to form a storage node electrode pattern;

removing the first porous layer to form a fin-shaped node electrode;

forming a dielectric layer on the storage node electrode; and forming a third conductive layer on the dielectric layer.

8. The method claimed in claim 7, further comprising the step of sequentially forming an etch stop layer and an insulating layer on the semiconductor substrate before the step of forming the first conductive layer.

9. The method claimed in claim 8, wherein the step of forming the storage node contact includes removing a selected portion of the first porous layer, the first conductive layer, the insulating layer and the etch stop layer to expose a portion of the semiconductor substrate.

10. The method claimed in claim 8, wherein the step of forming the storage node electrode pattern includes the steps of:

forming a photoresist pattern;

selectively removing the second porous layer, the second conductive layer, the first porous layer, the first conductive layer and the insulating layer through dry etching using the photoresist pattern as a mask; and selectively removing the insulating layer and the first porous layer by wet etching to form the storage node electrode pattern.

11. The method claimed in claim 7, wherein the steps of converting the first and second conductive layers to porous layers each comprises the steps of:

irradiating the first or second conductive layer with light, the first or second conductive layer being dipped in HF solution; and dry-oxidizing the first or second conductive layer.

12. The method claimed in claim 11, wherein the concentration of the HF solution is approximately 20% to 48%.

13. The method claimed in claim 11, wherein the step of irradiating with light uses a halogen lamp as a light source.

14. The method claimed in claim 11, wherein the dry oxidation is carried out at a temperature around 950° C. for 30 minutes.

15. The method claimed in claim 7, wherein the first porous layer is thicker than the second porous layer.

* * * * *